(12) United States Patent
Tzu

(10) Patent No.: US 6,423,455 B1
(45) Date of Patent: Jul. 23, 2002

(54) METHOD FOR FABRICATING A MULTIPLE MASKING LAYER PHOTOMASK

(75) Inventor: San-De Tzu, Taipei (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/585,189

(22) Filed: Jun. 1, 2000

(51) Int. Cl.[7] .................................................. G03F 9/00
(52) U.S. Cl. .......................................................... 430/5
(58) Field of Search ............................ 430/5, 322, 323, 430/324

(56) References Cited

U.S. PATENT DOCUMENTS

| | | | |
|---|---|---|---|
| 5,716,738 A | 2/1998 | Garza | 430/5 |
| 5,783,337 A | 7/1998 | Tzu et al. | 430/5 |
| 5,789,117 A | 8/1998 | Chen | 430/5 |
| 5,804,336 A | 9/1998 | Rolfson | 430/5 |
| 5,817,439 A | * 10/1998 | Tzu et al. | 430/5 |

* cited by examiner

Primary Examiner—S. Rosasco

(74) Attorney, Agent, or Firm—Tung & Associates

(57) ABSTRACT

Within a method for fabricating a photomask there is first provided a transparent substrate having formed thereover a blanket first masking layer, in turn having formed thereover a blanket second masking layer, in turn having formed thereover a patterned photoresist layer having an active patterned region and a border region adjoining the active patterned region. There is then etched, while employing a first etch method and while employing the patterned photoresist layer as a first etch mask layer, the blanket second masking layer and the blanket first masking layer to form a patterned second masking layer and a patterned first masking layer. There is then irradiated, while employing a cutout mask, at least a portion of the active patterned region of the patterned photoresist layer such that at least the portion of the active patterned region of the patterned photoresist layer is removed from over the transparent substrate while at least a portion of the border region of the patterned photoresist layer is not removed from over the substrate, to thus form a further patterned photoresist layer. There is then etched, while employing a second etch method, a portion of the patterned second masking layer newly exposed to form a further patterned second masking layer. Finally, there is then stripped from over the transparent substrate the further patterned photoresist layer. The method is particularly useful for forming an attenuated phase shift mask (APSM) photomask.

14 Claims, 2 Drawing Sheets

METHOD FOR FABRICATING A MULTIPLE MASKING LAYER PHOTOMASK

BACKGROUND OF THE INVENTION

1. Field of the Invention

The present invention relates generally to methods for fabricating photomasks which in turn are employed for fabricating microelectronic fabrications. More particularly, the present invention relates to methods for fabricating multiple masking layer photomasks which in turn are employed for fabricating microelectronic fabrications.

2. Description of the Related Art

Microelectronic fabrications are formed from microelectronic substrates over which are formed patterned microelectronic conductor layers which are separated by microelectronic dielectric layers. Common in the art of microelectronic fabrication for use when fabricating microelectronic fabrications is the use of photolithographic methods which in turn employ photomasks for defining dimensions of patterned photoresist layers which further in turn are employed for defining dimensions of microelectronic devices and patterned microelectronic layers within microelectronic fabrications.

As microelectronic fabrication integration levels have increased and microelectronic device and patterned microelectronic conductor layer dimensions have decreased, it has become common in the art of microelectronic fabrication when employing photolithographic methods which employ photomasks for defining dimensions of patterned photoresist layers which further in turn are employed for defining dimensions of microelectronic devices and patterned microelectronic layers within microelectronic fabrications to employ photomask constructions which provide for enhanced intensity resolution of a photoexposure radiation beam which is employed for photoexposing a blanket photoresist layer when forming a patterned photoresist layer. As is understood by a person skilled in the art, a class of photomask constructions which provides for such an enhanced intensity resolution of a photoexposure radiation beam employed for photoexposing a blanket photoresist layer when forming a patterned photoresist layer is the phase shift mask (PSM) class of photomask constructions.

While there exists within the art of microelectronic fabrication various types of phase shift mask (PSM) photomask constructions which effectively provide for enhanced intensity resolution of a photoexposure radiation beam passed through a phase shift mask (PSM) photomask construction for use when forming a patterned photoresist layer from a blanket photoresist layer, from a practical perspective of ease of fabrication, a particularly desirable phase shift mask (PSM) photomask construction is an attenuated phase shift mask (APSM) photomask construction. A schematic cross-sectional diagram of an attenuated phase shift mask (APSM) photomask construction is illustrated within the schematic cross-sectional diagram of FIG. 1.

As is illustrated within the schematic cross-sectional diagram of FIG. 1, there is shown an attenuated phase shift mask (APSM) photomask construction 14 comprising a transparent substrate 10 having formed thereupon a series of patterned semi-transparent masking layers 12a, 12b and 12c. Within the attenuated phase shift mask (APSM) photomask construction 14 whose schematic cross-sectional diagram is illustrated in FIG. 1, the series of patterned semi-transparent masking layers 12a, 12b and 12c is formed of a semi-transparent masking material, typically and preferably having a transmissivity of from about 3 to about 8 percent of an incident photoexposure radiation beam 16 incident upon the attenuated phase shift mask (APSM) photomask construction 14. As is further illustrated within the schematic cross-sectional diagram of FIG. 1, the incident photoexposure radiation beam 16 comprises: (1) a first incident photoexposure radiation beam 16a which passes through only the transparent substrate 10; and (2) a second incident photoexposure radiation beam 16b which passes through both the transparent substrate 10 and the patterned semi-transparent masking layer 12c. As is finally illustrated within the schematic cross-sectional diagram of FIG. 1, the patterned semi-transparent masking layer 12c is formed of a composition, and in particular of a thickness, such that subsequent to passing through the attenuated phase shift mask (APSM) photomask construction 14 whose schematic cross-sectional diagram is illustrated in FIG. 1 the first incident photoexposure radiation beam 16a and the second incident photoexposure radiation beam 16b are 180 degrees out of phase, which in turn provides the enhanced intensity resolution of the photoexposure radiation beam 16 once passed through the attenuated phase shift mask (APSM) photomask construction 14 whose schematic cross-sectional diagram is illustrated in FIG. 1.

While attenuated phase shift mask (APSM) photomask constructions are thus desirable within the art of microelectronic fabrication for ultimately providing within the art of microelectronic fabrication microelectronic devices and patterned microelectronic layers with enhanced resolution, phase shift mask (PSM) photomask constructions in general, and attenuated phase shift mask (APSM) photomask constructions in particular, are not entirely without problems in the art of microelectronic fabrication. In that regard and in particular with respect to attenuated phase shift mask (APSM) photomask constructions, while attenuated phase shift mask (APSM) photomask constructions do in fact provide a comparatively simple phase shift mask (PSM) photomask construction in comparison with other types of phase shift mask (PSM) photomask constructions, by the nature of their construction which includes a series of patterned semi-transparent layers, attenuated phase shift mask (APSM) photomask constructions also suffer from enhanced photoexposure radiation leakage in locations where such photoexposure radiation leakage might otherwise be undesirable.

It is thus in general towards the goal of providing, for use when fabricating microelectronic fabrications, photomask constructions, such as but not limited to attenuated phase shift mask (APSM) photomask constructions, with enhanced properties, that the present invention is directed.

Various methods for fabricating photomask constructions, and the photomask constructions resulting from the methods, have been disclosed in the art of microelectronic fabrication for providing photomask constructions with desirable properties for use to within the art of microelectronic fabrication.

For example, Garza, in U.S. Pat. No. 5,716,738, discloses an attenuated phase shift mask (APSM) photomask construction having an opaque border layer which attenuates spurious photoexposure of a photoresist layer which is photoexposed while employing the attenuated phase shift mask (APSM) photomask construction. To realize the foregoing object, the opaque border layer within the attenuated phase shift mask (APSM) photomask construction is formed employing an opaque photosensitive material, such as an opaque photosensitive polyimide material.

In addition, Tzu et al., in U.S. Pat. No. 5,783,337, discloses a method for fabricating an attenuated phase shift mask (APSM) photomask construction which similarly also employs an opaque border layer which attenuates spurious photoexposure of a photoresist layer which is photoexposed while employing the attenuated phase shift mask (APSM) photomask construction. To realize the foregoing object, the method employs when fabricating the attenuated phase shift mask (APSM) photomask construction a single blanket photoresist layer which is sequentially photoexposed twice with varying intensity of a focused electron beam radiation source such that incident to further processing of the twice photoexposed blanket photoresist layer there may be formed from a blanket chromium layer formed beneath the blanket photoresist layer a patterned chromium layer for use on the opaque border layer surrounding an active region of the attenuated phase shift mask (APSM) photomask construction.

Further, Chen, in U.S. Pat. No. 5,789,117, also discloses a method for fabricating a phase shift mask (PSM) photomask construction which similarly also employs an opaque border layer which attenuates spurious photoexposure of a photoresist layer which is photoexposed while employing the phase shift mask (PSM) photomask construction, but wherein there is employed only a single photolithographic sequence when fabricating the phase shift mask (PSM) photomask construction. To realize the foregoing object, the method employs a direct transfer of a pre-patterned photoresist layer to a singly patterned opaque chromium layer from which is formed the opaque border layer when forming the phase shift mask (PSM) photomask construction.

Finally, Rolfson, in U.S. Pat. No. 5,804,336, similarly also discloses a method for forming, with enhanced process efficiency, a photomask construction, such as an attenuated phase shift mask (APSM) photomask construction, with an opaque border layer which attenuates spurious photoexposure of a photoresist layer which is photoexposed while employing the photomask construction. To realize the foregoing object, the method employs an electrochemical plating of at least one of: (1) a first metal layer which forms the opaque border layer within the photomask construction; and (2) a patterned second metal layer which forms an active region of the photomask construction.

The teachings or each of the foregoing related art references is incorporated herein fully by reference.

Desirable in the art of microelectronic fabrication are additional methods and materials which may be employed for forming for use when fabricating microelectronic fabrications photomask constructions, such as but not limited to phase shift mask (PSM) photomask constructions, further such as but not limited to attenuated phase shift mask (APSM) photomask constructions, with enhanced properties.

It is towards the foregoing object that the present invention is directed.

SUMMARY OF THE INVENTION

A first object of the present invention is to provide a method for forming, for use when fabricating a microelectronic fabrication, a photomask construction, such as a phase shift mask (PSM) photomask construction, further such as an attenuated phase shift mask (APSM) photomask construction.

A second object of the present invention is to provide a method in accord with the first object of the present invention, wherein the photomask construction is fabricated with enhanced properties.

A third object of the present invention is to provide a method in accord with the first object of the invention and the second object of the invention, which method is readily commercially implemented.

In accord with the objects of the present invention, there is provided by the present invention a method for fabricating a photomask construction. To practice the method of the present invention, there is first provided a transparent substrate. There is then formed over the transparent substrate a blanket first masking layer. There is then formed over the blanket first masking layer a blanket second masking layer. There is then formed over the blanket second masking layer a patterned photoresist layer having an active patterned region and a border region adjoining the active patterned region. There is then etched, while employing a first etch method and while employing the patterned photoresist layer as a first etch mask layer, the blanket second masking layer and the blanket first masking layer to form a patterned second masking layer and a patterned first masking layer. There is then irradiated, while employing a cutout mask, at least a portion of the active patterned region of the patterned photoresist layer such that at least the portion of the active patterned region of the patterned photoresist layer is removed from over the transparent substrate while at least a portion of the border region of the patterned photoresist layer is not removed from over the substrate to thus form from the patterned photoresist layer a further patterned photoresist layer which leaves exposed a portion of the patterned second masking layer. There is then etched, while employing a second etch method, the portion of the patterned second masking layer exposed beneath the further patterned photoresist layer to form a further patterned second masking layer. Finally, there is then stripped from over the transparent substrate the further patterned photoresist layer.

There is provided by the present invention a method for forming, for use when fabricating a microelectronic fabrication, a photomask construction, such as a phase shift mask (PSM) photomask construction, further such as an attenuated phase shift mask (APSM) photomask construction, wherein the photomask construction is provided with enhanced properties. The present invention realizes the foregoing object by employing when fabricating the photomask construction a cutout mask for selectively further irradiating a portion of a patterned photoresist layer in turn formed over a patterned second masking layer in turn formed over a patterned first masking layer such that there may be formed from the patterned photoresist layer a further patterned photoresist layer which serves as an etch mask for forming from the patterned second masking layer a further patterned second masking layer which within the context of the preferred embodiment of the present invention provides an opaque border layer within an attenuated phase shift mask (APSM) photomask construction.

The method of the present invention is readily commercially implemented. As will be illustrated within the context of the Description of the Preferred Embodiment which follows, the present invention employs methods and materials as are generally known in the art of microelectronic fabrication. Since it is a specific ordering of methods and materials which provides at least in part the present invention, rather than the existence of specific methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming, for use when fabricating a microelectronic fabrication, a photomask construction, such as a phase shift mask (PSM) photomask construction, further such as an attenuated phase shift mask (APSM) photomask construction, wherein the photomask construction is provided with enhanced properties. The present invention realizes the foregoing object by employing when fabricating the photomask construction a cutout mask for selectively further irradiating a portion of a patterned photoresist layer in turn formed over a patterned second masking layer in turn formed over a patterned first masking layer such that there may be formed from the patterned photoresist layer a further patterned photoresist layer which serves as an etch mask for forming from the patterned second masking layer a further patterned second masking layer which within the context of the preferred embodiment of the present invention provides an opaque border layer within an attenuated phase shift mask (APSM) photomask construction.

In accord with the above, while the preferred embodiment of the present invention illustrates the present invention within the context of efficiently and economically forming an attenuated phase shift mask (APSM) photomask construction having an opaque border layer adjoining an active region of the attenuated phase shift mask (APSM) photomask construction, the present invention may also be employed for forming any type of photomask construction which employs at minimum a pair of horizontally disposed masking layers where it is desired to selectively pattern at least one of the minimum of the pair of horizontally disposed masking layers with respect to at least an other of the minimum of the pair of horizontally disposed masking layers.

Figure 2:
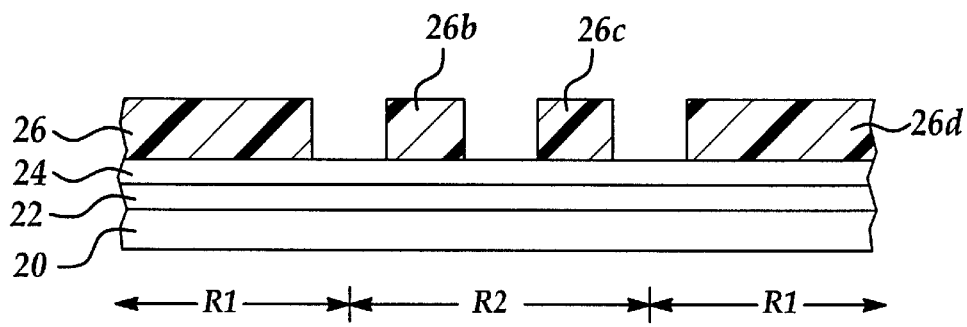
FIG. 2, FIG. 3, FIG. 4, FIG. 5, FIG. 6 and FIG. 7 show a series of schematic cross-sectional diagrams illustrating the results of progressive stages in forming an attenuated phase shift mask (APSM) photomask construction in accord with a preferred embodiment of the present invention.

Referring now to FIG. 2 to FIG. 7, there is shown a series of schematic cross-sectional diagrams illustrating the results of forming, in accord with a preferred embodiment of the present invention, an attenuated phase shift mask (APSM) photomask construction in accord with the present invention. Shown in FIG. 2 is a schematic cross-sectional diagram of the attenuated phase shift mask (APSM) photomask construction at an early stage in its fabrication in accord with the preferred embodiment of the present invention.

Figure 1:
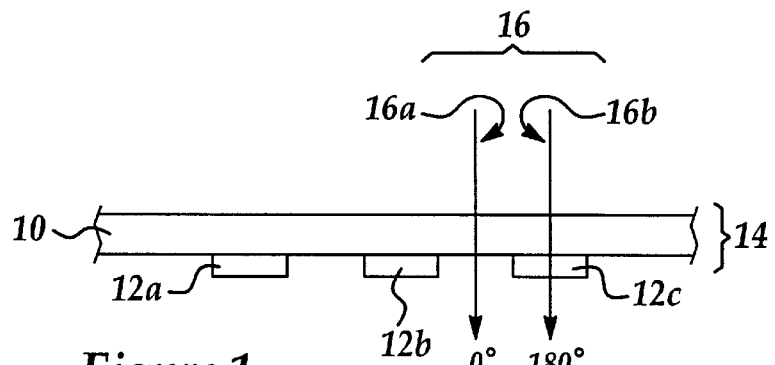
FIG. 1 shows a schematic cross-sectional diagram of an attenuated phase shift mask (APSM) photomask construction conventional in the art of microelectronic fabrication.

Shown in FIG. 2 is a transparent substrate 20 having formed thereupon and thereover: (1) a blanket first masking layer 22 in turn having formed thereupon and thereover; (2) a blanket second masking layer 24 in turn having formed thereupon and thereover; (3) a series of patterned photoresist layers 26a, 26b, 26c and 26d. Similarly, as is also illustrated within the schematic cross-sectional diagram of FIG. 1, the pair of patterned photoresist layers 26a and 26d is formed within a border region R1 of the attenuated phase shift mask (APSM) photomask construction whose schematic cross-sectional diagram is illustrated in FIG. 1, while the pair of patterned photoresist layers 26b and 26c is formed within an active region R2 of the attenuated phase shift mask (APSM) photomask construction whose schematic cross-sectional diagram is illustrated in FIG. 1.

Within the preferred embodiment of the present invention with respect to the transparent substrate 10, the transparent substrate 10 is typically and preferably formed of a material transparent to a dose of photoexposure radiation to which an attenuated phase shift mask (APSM) photomask construction derived from the attenuated phase shift mask (APSM) photomask construction whose schematic cross-sectional diagram is illustrated in FIG. 2 is ultimately exposed. Thus, typically and preferably, the transparent substrate 10 is formed of a material transparent to radiation at least in the near ultraviolet (i.e., 365 nanometer) region and the deep ultraviolet (i.e., 254 nanometer) region. Similarly, and also typically and preferably, the transparent substrate 20 is formed of a glass or quartz transparent material, formed to a thickness of from about 5 to about 7 millimeters.

Within the preferred embodiment of the present invention with respect to the blanket first masking layer 22, the blanket first masking layer 22 is typically and preferably formed of a semi-transparent masking material having a transmissivity of from about 3 to about 8 percent for the wavelength of photoexposure radiation to which is exposed the attenuated phase shift mask (APSM) photomask construction derived from the attenuated phase shift mask (APSM) photomask construction whose schematic cross-sectional diagram is illustrated in FIG. 2. Although any of several materials may thus be employed for forming the blanket first masking layer 22, the blanket first masking layer 22 is typically and preferably formed of a "leaky" chromium material, such as but not limited to a chromium oxide material, a chromium nitride material or a chromium oxynitride material, or in the alternative from a molybdenum silicide oxynitride material. Similarly, typically and preferably, the blanket first masking layer 22 is formed to a thickness of about ½ the wavelength of the incident photoexposure radiation to which the attenuated phase shift mask (APSM) derived from the attenuated phase shift mask (APSM) whose schematic cross-sectional diagram is illustrated in FIG. 2 is ultimately exposed. Thus, for photoexposure radiation in the near ultraviolet (i.e., 365 nanometer) wavelength region the thickness of the blanket first masking layer 22 is typically and preferably from about 1300 to about 2500 angstroms and for photoexposure radiation in the deep ultraviolet (i.e., 254 nanometer) wavelength region the thickness of the blanket first masking layer 22 is typically and preferably from about 850 to about 1300 angstroms.

Within the preferred embodiment of the present invention with respect to the blanket second masking layer 24, the blanket second masking layer 24 is typically and preferably formed of a masking material which is opaque to the wavelength of photoexposure radiation to which the attenuated phase shift mask (APSM) derived from the attenuated phase shift mask (APSM) whose schematic cross-sectional diagram is illustrated in FIG. 2 is ultimately exposed. Although any of several materials may be employed for forming the blanket second masking layer 24, the blanket second masking layer 24 is typically and preferably formed of a chromium metal material or alternatively an other metal material, typically and preferably formed to a thickness of from about 700 to about 1100 angstroms over and upon the blanket first masking layer 22.

Finally, within the preferred embodiment of the present invention with respect to the patterned photoresist layers 26a, 26b, 26c and 26d, although the patterned photoresist layers 26a, 26b, 26c and 26d may be formed from any of several types of photoresist materials as are conventional in the art of microelectronic fabrication, including photoresist materials selected from the groups of photoresist materials including but not limited to positive photoresist materials and negative photoresist materials, for the preferred embodiment of the present invention, the series of patterned photoresist layers 26a, 26b, 26c and 26d is typically and preferably formed of a positive photoresist material, such as but not limited to a polymethyl methacrylate (PMMA) positive photoresist material. Typically and preferably, the series of patterned photoresist layers 26a, 26b, 26c and 26d is formed to a thickness of from about 2000 to about 5000 angstroms each.

Figure 3:
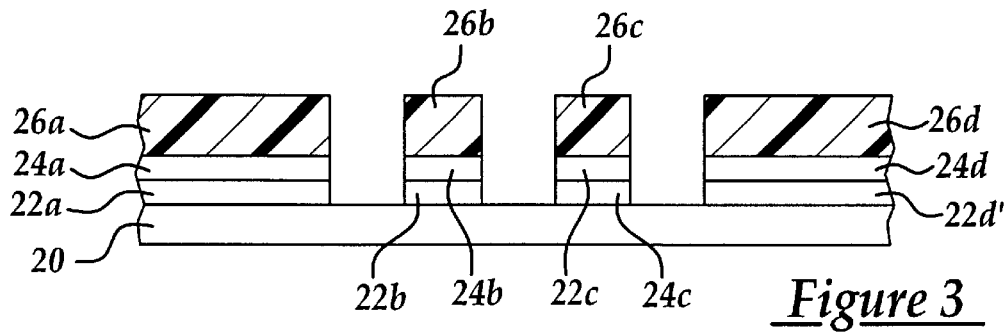

Referring now to FIG. 3, there is shown a schematic cross-sectional diagram illustrating the results of further processing of the attenuated phase shift mask (APSM) photomask construction whose schematic cross-sectional diagram is illustrated in FIG. 2.

Shown in FIG. 3 is a schematic cross-sectional diagram of an attenuated phase shift mask (APSM) photomask construction otherwise equivalent to the attenuated phase shift mask (APSM) photomask construction whose schematic cross-sectional diagram is illustrated in FIG. 2, but wherein the blanket second masking layer 24 has been patterned to form a series of patterned second masking layers 24a, 24b, 24c and 24d and the blanket first masking layer 22 has been patterned to form a series of patterned first masking layers 22a, 22b, 22c and 22d, while employing the series of patterned photoresist layers 26a, 26b, 26c and 26d as an etch mask layer.

Although not specifically illustrated within the schematic cross-sectional diagram of FIG. 3, the blanket second masking layer 24 is patterned to form the series of patterned second masking layers 24a, 24b, 24c and 24d, and the blanket first masking layer 22 is patterned to form the series of patterned first masking layers 22a, 22b, 22c and 22d, while typically and preferably employing a sequential pair of etchants which is appropriate to the pair of materials from which is formed the blanket second masking layer 24 and the blanket first masking layer 22. Within the context of the preferred embodiment of the present invention where the blanket second masking layer 22 is typically and preferably formed of a chromium metal material and the blanket first masking layer is typically and preferably formed of a molybdenum silicide oxynitride material, there is typically and preferably employed: (1) a hypochlorous acid and ceric ammonium nitrate aqueous solution etchant for etching the blanket second masking layer 24 when forming the series of patterned second masking layers 24a, 24b, 24c and 24d; and (2) an active $CF_4/O_2$ or $SFG/Ar$ containing plasma gas etchant for etching the blanket first masking layer 22 when forming the patterned first masking layers 22a, 22b, 22c and 22d.

Figure 4:
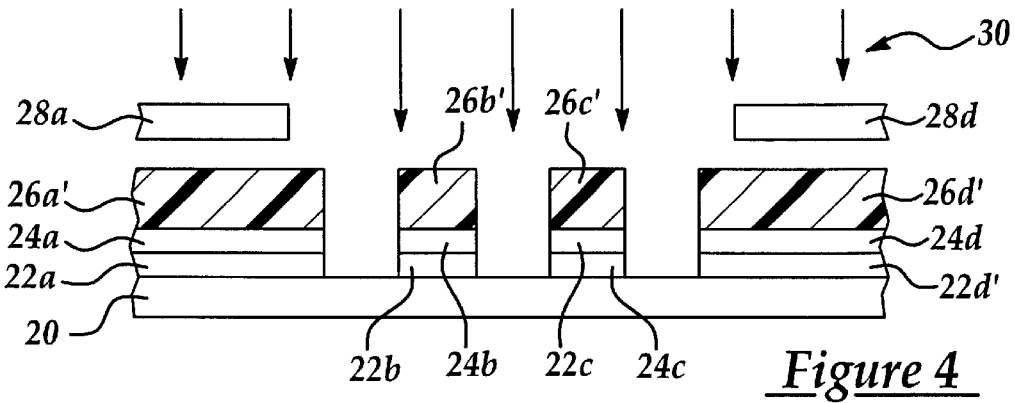

Referring now to FIG. 4, there is shown a schematic cross-sectional diagram illustrating the results of further processing of the attenuated phase shift mask (APSM) photomask construction whose schematic cross-sectional diagram is illustrated in FIG. 3.

Shown in FIG. 4 is a schematic cross-sectional diagram of an attenuated phase shift mask (APSM) photomask construction otherwise equivalent to the attenuated phase shift mask (APSM) photomask construction whose schematic cross-sectional diagram is illustrated in FIG. 3, but wherein at least a portion of the patterned photoresist layers 26b and 26c within the active region R2 of the attenuated phase shift mask (APSM) photomask construction has been irradiated while at least a portion of the patterned photoresist layers 26a and 26d in the border region R2 of the attenuated phase shift mask (APSM) photomask construction has not been irradiated to thus form from the series of patterned photoresist layers 26a, 26b, 26c and 26d a series of irradiated patterned photoresist layers 26a', 26b', 26c' and 26d', while employing a cutout mask 28a and 28b as a mask, and while employing a radiation beam 30. Within the preferred embodiment of the present invention, and as is illustrated within the schematic cross-sectional diagram of FIG. 4, typically and preferably both of the patterned photoresist layers 26b and 26c within the active region R2 of the attenuated phase shift mask (APSM) photomask construction whose schematic cross-sectional diagram is illustrated in FIG. 4 are fully irradiated when forming the irradiated patterned photoresist layers 26b' and 26c', while each of the patterned photoresist layers 26a and 26d within the border region R1 of the attenuated phase shift mask (APSM) photomask construction whose schematic cross-sectional diagram is illustrated in FIG. 4 are partially irradiated when forming the irradiated patterned photoresist layers 26a' and 26d'.

Within the preferred embodiment of the present invention with respect to the radiation beam 30, although the radiation beam 30 may be formed from any type of radiation which either directly or intrinsically provides the irradiated patterned photoresist layers 26a', 26b', 26c' and 26d' at least a portion of which are more soluble or more readily removable from the attenuated phase shift mask (APSM) photomask construction whose schematic cross-sectional diagram is illustrated in FIG. 4, such types of radiation including but not limited to ultraviolet radiation, ion radiation and electron radiation, for the preferred embodiment of the present invention the radiation beam 30 is typically and preferably formed of ultraviolet radiation. Within the preferred embodiment of the present invention, the radiation beam 30 is typically and preferably a flood radiation, which when provided employing ultraviolet radiation is provided at a dose of from about 800 to about 1400 watts (or 10 $mw/cm^2$ or 50 $mw/cm^2$) totally reflected from a mercury lamp ultraviolet radiation source onto the surface of an eight inch square transparent substrate 20 which comprises the attenuated phase shift mask (APSM) photomask construction whose schematic cross-sectional diagram is illustrated in FIG. 4.

Within the preferred embodiment of the present invention with respect to the cutout mask 28a and 28b, the cutout mask 28a and 28b may comprise a separate mask employed within a photoexposure apparatus which is employed for fabricating the attenuated phase shift mask (APSM) whose schematic cross-sectional diagram is illustrated in FIG. 4, or in the alternative the cutout mask 28a and 28b may simple comprise a set of blades which shutter portions of the radiation beam 30 such that those portions of the radiation beam 30 do not fully irradiate each of the patterned photoresist layers 26a, 26b, 26c and 26c when forming the series of irradiated patterned photoresist layers 26a', 26b', 26c' and 26d' within the attenuated phase shift mask (APSM) whose schematic cross-sectional diagram is illustrated in FIG. 4.

Figure 5:
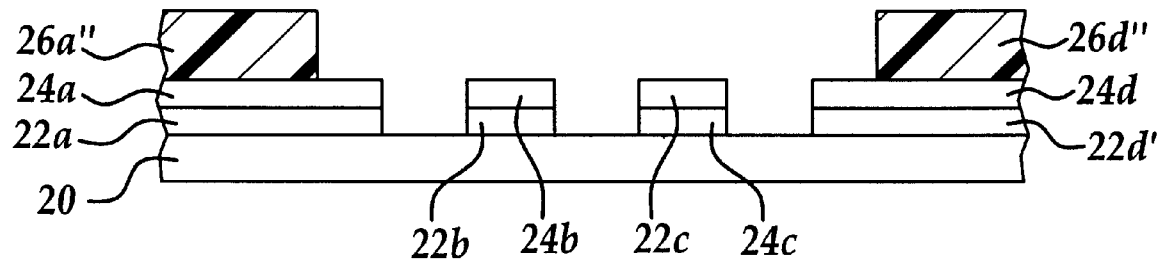

Referring now to FIG. 5, there is shown a schematic cross-sectional diagram illustrating the results of further processing of the attenuated phase shift mask (APSM) photomask construction whose schematic cross-sectional diagram is illustrated in FIG. 4.

Shown in FIG. 5 is a schematic cross-sectional diagram of an attenuated phase shift mask (APSM) photomask construction otherwise equivalent to the attenuated phase shift mask (APSM) photomask construction whose schematic cross-sectional diagram is illustrated in FIG. 4, but wherein the irradiated portions of the irradiated patterned photoresist layers 26a', 26b', 26c' and 26d' have been removed to leave remaining the further patterned photoresist layers 26a" and 26d".

Although the schematic cross-sectional diagram of FIG. 4 and the schematic cross-sectional diagram of FIG. 5 illustrate the present invention within the context of first irradiating the series of patterned photoresist layers 26a, 26b, 26c and 26d to form a series of irradiated patterned photoresist layers 26a', 26b', 26c' and 26d' and then nominally independently stripping irradiated portions of the irradiated patterned photoresist layers 26a', 26b', 26c' and 26d' to form the further patterned photoresist layers 26a" and 26d", it is also plausible within the present invention that the further patterned photoresist layers 26a" and 26d" may be formed directly incident to irradiating the series of patterned photoresist layers 26a, 26b 26c and 26d due to a direct radiative decomposition of the material from which is formed the series of patterned photoresist layers 26a, 26b, 26c and 26d. Thus, within the preferred embodiment of the present invention, there may be employed a direct radiation beam 30 exposure of the series of patterned photoresist layers 26a, 26b, 26c and 26d to form the pair of further patterned photoresist layers 26a" and 26b". Alternatively, for example and without limitation, within the preferred embodiment of the present invention the radiation beam 30 may sufficiently transform portions of the patterned photoresist layers 26a, 26b, 26c and 26d when forming the series of irradiated patterned photoresist layers 26a', 26b', 26c' and 26d' such that those irradiated portions are more susceptible to removal while employing additional processing of the series of irradiated patterned photoresist layers 26a', 26b', 26c' and 26d'. Such additional processing may include, but is not limited to oxygen containing plasma processing.

Figure 6:
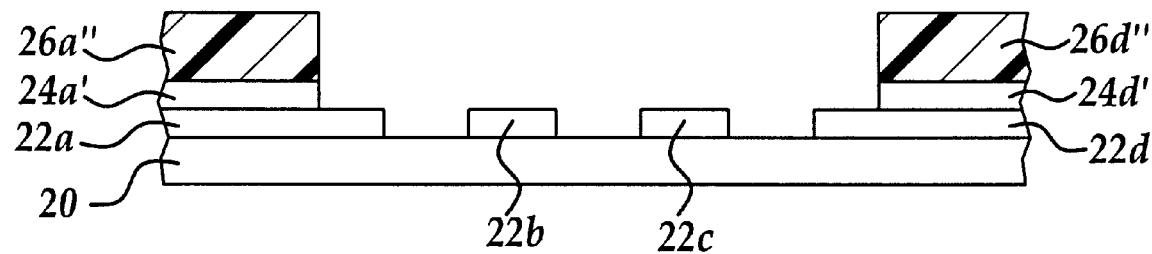

Referring now to FIG. 6, there is shown a schematic cross-sectional diagram illustrating the results of further processing of the attenuated phase shift mask (APSM) photomask construction whose schematic cross-sectional diagram is illustrated in FIG. 5.

Shown in FIG. 6 is a schematic cross-sectional diagram of an attenuated phase shift mask (APSM) photomask construction otherwise equivalent to the attenuated phase shift mask (APSM) photomask construction whose schematic cross-sectional diagram is illustrated in FIG. 5, but wherein: (1) the pair of patterned second masking layers 24a and 24b has been patterned to form a pair of further patterned second masking layers 24a' and 24d' while employing the pair of further patterned photoresist layers 26a" and 26d" as a pair of etch mask layers; and (2) the pair of patterned second masking layers 24b and 24c has been stripped from the attenuated phase shift mask (APSM) photomask construction.

To form the attenuated phase shift mask (APSM) photomask construction whose schematic cross-sectional diagram is illustrated in FIG. 6 from the attenuated phase shift mask (APSM) photomask construction whose schematic cross-sectional diagram is illustrated in FIG. 5, there is employed an etchant analogous or equivalent to the etchant employed for forming from the blanket second masking layer 24 within the attenuated phase shift mask (APSM) photomask construction whose schematic cross-sectional diagram is illustrated in FIG. 2 the series of patterned second masking layers 24a, 24b, 24c and 24d within the attenuated phase shift mask (APSM) photomask construction whose schematic cross-sectional diagram is illustrated in FIG. 3.

Figure 7:
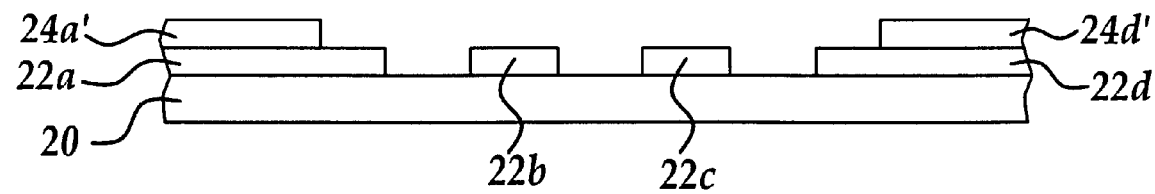

Referring now to FIG. 7, there is shown a schematic cross-sectional diagram illustrating the results of further processing of the attenuated phase shift mask (APSM) photomask construction whose schematic cross-sectional diagram is illustrated in FIG. 6.

Shown in FIG. 7 is a schematic cross-sectional diagram of an attenuated phase shift mask (APSM) photomask construction otherwise equivalent to the attenuated phase shift mask (APSM) photomask construction whose schematic cross-sectional diagram is illustrated in FIG. 6, but wherein there has been stripped from the attenuated phase shift mask (APSM) photomask construction the pair of further patterned photoresist layers 26a" and 26d".

The pair of further patterned photoresist layers 26a" and 26b" may be stripped from the attenuated phase shift mask (APSM) photomask construction whose schematic cross-sectional diagram is illustrated in FIG. 6 to provide the attenuated phase shift mask (APSM) photomask construction whose schematic cross-sectional diagram is illustrated in FIG. 7 while employing photoresist stripping methods and materials as are conventional in the art of microelectronic fabrication.

Upon forming the attenuated phase shift mask (APSM) photomask construction whose schematic cross-sectional diagram is illustrated in FIG. 7, there is provided within the context of the preferred embodiment of the present invention an attenuated phase shift mask (APSM) photomask construction with enhanced manufacturing efficiency. The attenuated phase shift mask (APSM) photomask construction so formed realizes the foregoing object by employing a cutout mask and a flood radiation exposure, rather than a lithographically defined radiation exposure, when forming a pair of further patterned photoresist layers which assist in defining on opaque border layer within the attenuated phase shift mask (APSM) photomask construction.

As is understood by a person skilled in the art, although the preferred embodiment of the present invention has been disclosed and illustrated within the context of a series of schematic cross-sectional diagrams illustrating the results of progressive stages in fabrication of an attenuated phase shift mask (APSM) photomask construction fabricated in accord with the preferred embodiment of the present invention, a photomask construction, such as an attenuated phase shift mask (APSM) photomask construction, fabricated in accord with the present invention or the preferred embodiment of the present invention, has areally bidirectional characteristics corresponding with the schematic cross-sectional diagrams which illustrate the progressive stages in fabrication of the attenuated phase shift mask (APSM) photomask construction fabricated in accord with the preferred embodiment of the present invention. Such areally bidirectional characteristics are generally illustrated, for example and without limitation, within the related art references which are described within the Description of the Related Art, which related art references again are incorporated herein fully by reference.

As is further understood by a person skilled in the art, the preferred embodiment of the present invention is illustrative of the present invention rather than limiting of the present invention. Revisions and modification may be made to methods, materials, structures and dimensions through which is formed an attenuated phase shift mask (APSM) photomask construction in accord with the preferred embodiment of the present invention, while still providing a photomask construction, such as but not limited to an attenuated phase shift mask (APSM) photomask construction, in accord with the present invention, further in accord with the accompanying claims.

What is claimed is:

1. A method for fabricating a photomask comprising:

providing a transparent substrate;

forming over the transparent substrate a blanket first masking layer;

forming over the blanket first masking layer a blanket second masking layer;

forming over the blanket second masking layer a patterned photoresist layer having an active patterned region and a border region adjoining the active patterned region;

etching, while employing a first etch method and while employing the patterned photoresist layer as a first etch mask layer, the blanket second masking layer and the blanket first masking layer to form a patterned second masking layer and a patterned first masking layer;

irradiating, while employing a cutout mask, at least a portion of the active patterned region of the patterned photoresist layer such that at least the portion of the active patterned region of the patterned photoresist layer is removed from over the transparent substrate while at least a portion of the border region of the patterned photoresist layer is not removed from over the substrate to thus form from the patterned photoresist layer a further patterned photoresist layer which leaves exposed a portion of the patterned second masking layer;

etching, while employing a second etch method, the portion of the patterned second masking layer exposed beneath the further patterned photoresist layer to form a further patterned second masking layer; and stripping from over the transparent substrate the further patterned photoresist layer.

2. The method of claim 1 wherein the blanket first masking layer is formed to a thickness of from about 850 to about 1300 angstroms for DUV and 1300–2500 Å for I-line.

3. The method of claim 1 wherein the blanket second masking layer is formed to a thickness of from about 700 to about 1100 angstroms.

4. The method of claim 1 wherein when irradiating at least the portion of the active patterned region of the patterned photoresist layer while employing the cutout mask there is employed a radiation beam selected from the group including but not limited to an ultraviolet radiation beam, an ion radiation beam and an electron radiation beam.

5. The method of claim 1 wherein the irradiation of at least the portion of the active patterned region of the patterned photoresist layer while employing the cutout mask directly decomposes and removes at least the portion of the active patterned region of the patterned photoresist layer so irradiated when forming the further patterned photoresist layer.

6. The method of claim 1 wherein the irradiation of at least the portion of the active patterned region of the patterned photoresist layer while employing the cutout mask transforms the irradiated portion of the patterned photoresist layer such that it is more readily removable with additional processing when forming the further patterned photoresist layer.

7. A method for fabricating a phase shift mask (PSM) photomask comprising:

providing a transparent substrate;

forming over the transparent substrate a blanket first semi-transparent masking layer;

forming over the blanket first semi-transparent masking layer a blanket second opaque masking layer;

forming over the blanket second opaque masking layer a patterned photoresist layer having an active patterned region and a border region adjoining the active patterned region;

etching, while employing a first etch method and while employing the patterned photoresist layer as a first etch mask layer, the blanket second opaque masking layer and the blanket first semi-transparent masking layer to form a patterned second opaque masking layer and a patterned first semi-transparent masking layer;

irradiating, while employing a cutout mask, at least a portion of the active patterned region of the patterned photoresist layer such that at least the portion of the active patterned region of the patterned photoresist layer is removed from over the transparent substrate while at least a portion of the border region of the patterned photoresist layer is not removed from over the substrate to thus form from the patterned photoresist layer a further patterned photoresist layer which leaves exposed a portion of the patterned second opaque masking layer;

etching, while employing a second etch method, the portion of the patterned second opaque masking layer exposed beneath the further patterned photoresist layer to form a further patterned second opaque masking layer; and stripping from over the transparent substrate the further patterned photoresist layer.

8. The method of claim 7 wherein the blanket first semi-transparent masking layer is formed to a thickness of from about 850 to about 1300 angstroms for DUV.

9. The method of claim 7 wherein the blanket first semi-transparent masking layer is formed of a semi-transparent masking material selected from the group consisting of chromium oxide, chromium nitride, chromium oxynitride and molybdenum silicide oxynitride.

10. The method of claim 7 wherein the blanket second opaque masking layer is formed to a thickness of from about 700 to about 1100 angstroms.

11. The method of claim 7 wherein the blanket second opaque masking layer is formed of chromium.

12. The method of claim 7 wherein when irradiating at least the portion of the active patterned region of the patterned photoresist layer while employing the cutout mask there is employed a radiation beam selected from the group including but not limited to an ultraviolet radiation beam, an ion radiation beam and an electron radiation beam.

13. The method of claim 7 wherein the irradiation of at least the portion of the active patterned region of the patterned photoresist layer while employing the cutout mask directly decomposes and removes at least the portion of the active patterned region of the patterned photoresist layer so irradiated when forming the further patterned photoresist layer.

14. The method of claim 7 wherein the irradiation of at least the portion of the active patterned region of the patterned photoresist layer while employing the cutout mask transforms the irradiated portion of the patterned photoresist layer such that it is more readily removable with additional processing when forming the further patterned photoresist layer.

* * * * *